United States Patent

Gabriel et al.

Patent Number: 6,080,677
Date of Patent: *Jun. 27, 2000

[54] METHOD FOR PREVENTING MICROMASKING IN SHALLOW TRENCH ISOLATION PROCESS ETCHING

[75] Inventors: Calvin Gabriel, Cupertino; Ian Robert Harvey, Livermore; Linda Leard, San Jose, all of Calif.

[73] Assignee: VLSI Technology, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/002,103

[22] Filed: Dec. 30, 1997

Related U.S. Application Data

[63] Continuation-in-part of application No. 08/877,095, Jun. 17, 1997.

[51] Int. Cl.$^7$ .................................................. H01L 21/76
[52] U.S. Cl. ..................... 438/710; 438/706; 438/711; 438/712; 438/724
[58] Field of Search ...................... 438/710, 711, 438/723, 724, 700, 701, 424, 435; 134/1.1

[56] References Cited

U.S. PATENT DOCUMENTS

| | | | |
|---|---|---|---|
| 5,436,190 | 7/1995 | Yang et al. | 437/67 |
| 5,445,710 | 8/1995 | Hori et al. | 156/643.1 |
| 5,693,147 | 12/1997 | Ward et al. | 134/1.1 |
| 5,719,085 | 2/1998 | Moon et al. | 438/296 |
| 5,879,575 | 3/1999 | Tepman et al. | 216/68 |

*Primary Examiner*—Benjamin L. Utech
*Assistant Examiner*—Lan Vinh
*Attorney, Agent, or Firm*—Douglas L. Weller

[57] ABSTRACT

An isolation structure on an integrated circuit is formed using a shallow trench isolation process. A layer of buffer oxide is formed on a substrate. A layer of nitride is formed on the layer of buffer oxide. The layer of nitride and the layer of buffer oxide are patterned to form a trench area. The substrate including the trench area is subjected to a plasma comprising $H_2O$ vapor, and a gaseous fluorocarbon or a fluorinated hydrocarbon gas to clean impurities on the trench area. The substrate is etched to form a trench within the trench area.

18 Claims, 5 Drawing Sheets

METHOD FOR PREVENTING MICROMASKING IN SHALLOW TRENCH ISOLATION PROCESS ETCHING

CROSS REFERENCE TO RELATED APPLICATION

This application is a continuation in part of application Ser. No. 08/877,095, filed Jun. 17, 1997, by Ian Robert Harvey, Xi-Wei Lin and Ramiro Solis for PLASMA ASH FOR SILICON SURFACE PREPARATION.

BACKGROUND

The present invention concerns the fabrication of integrated circuits and pertains particularly to a method for preventing micromasking in shallow trench isolation process etching.

In fabricating integrated circuits, various processes are used to form field oxide. For example, a local oxidation of silicon (LOCOS) process is often used to form field oxide regions. In a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed.

Shallow trench isolation (STI) is gradually replacing conventional LOCOS process for the formation of an isolation structure as technology is evolving to submicron geometry. STI has various advantages over the conventional LOCOS process. For example, STI allows for the planarization of the isolation structure. This results in better control of critical dimension (CD) when defining a gate stack of a transistor. Better control of CD when defining the gate stack results in better control of CD in further processing steps which occur after the gate stack is defined.

During conventional STI process, a buffer oxide/nitride mask is patterned onto the silicon wafer to define the trench area. Before a trench etch is performed, a cleaning is performed with wet chemicals such as sulfuric acid and hydrogen peroxide, typically ending with a spin-rinse-dry (SRD). The trench area is etched and filled by chemical vapor deposition (CVD) with a fill oxide so that, for an average trench width, local planarization between the trench and the nitride mask is achieved. The fill oxide is then polished back by chemical mechanical polishing (CMP) or etched back by dry plasma etch until it is flush with the nitride layer. The nitride mask is then removed, leaving the fill oxide extending above the trench. The fill oxide is then further removed and a planar surface is provided. This further removal of the fill oxide is done by dry or wet plasma etching of the fill oxide.

Unfortunately, SRD tools are prone to leaving water spots which can induce micromasking. The micromasking can result in a leakage site resulting in defective parts.

SUMMARY OF THE INVENTION

In accordance with the preferred embodiment of the present invention, an isolation structure on an integrated circuit is formed using a shallow trench isolation process. A layer of buffer oxide is formed on a substrate. A layer of nitride is formed on the layer of buffer oxide. The layer of nitride and the layer of buffer oxide are patterned to form a trench area. The substrate including the trench area is subjected to a plasma comprising $H_2O$ vapor, and a gaseous fluorocarbon or a fluorinated hydrocarbon gas to clean impurities on the trench area. The substrate is etched to form a trench within the trench area.

While the present invention allows for use of a variety of chemicals and flow rates to form the plasma, in one embodiment, $CF_4$ is introduced into an ashing environment at a flow rate of approximately 180 SCCM. $H_2O$ vapor is then introduced into the ashing environment at a flow rate of approximately 300 SCCM.

In the preferred embodiment, before subjecting the trench area to an ashing environment, the trench area is cleaned with wet chemicals and a spin rinse dry is performed. For example, the wet chemicals include sulfuric acid and/or hydrogen peroxide.

After etching, the trench is filled, for example, with a fill oxide. A part of the fill oxide is removed so that a remaining part of the fill oxide remaining in the trench is above a top surface of the substrate. The nitride layer is then removed.

The present invention prevents micromasking over a trench area. The micromasking resulting from prior art methods can result in leakage sites.

DESCRIPTION OF THE PREFERRED EMBODIMENT

Figure 1:
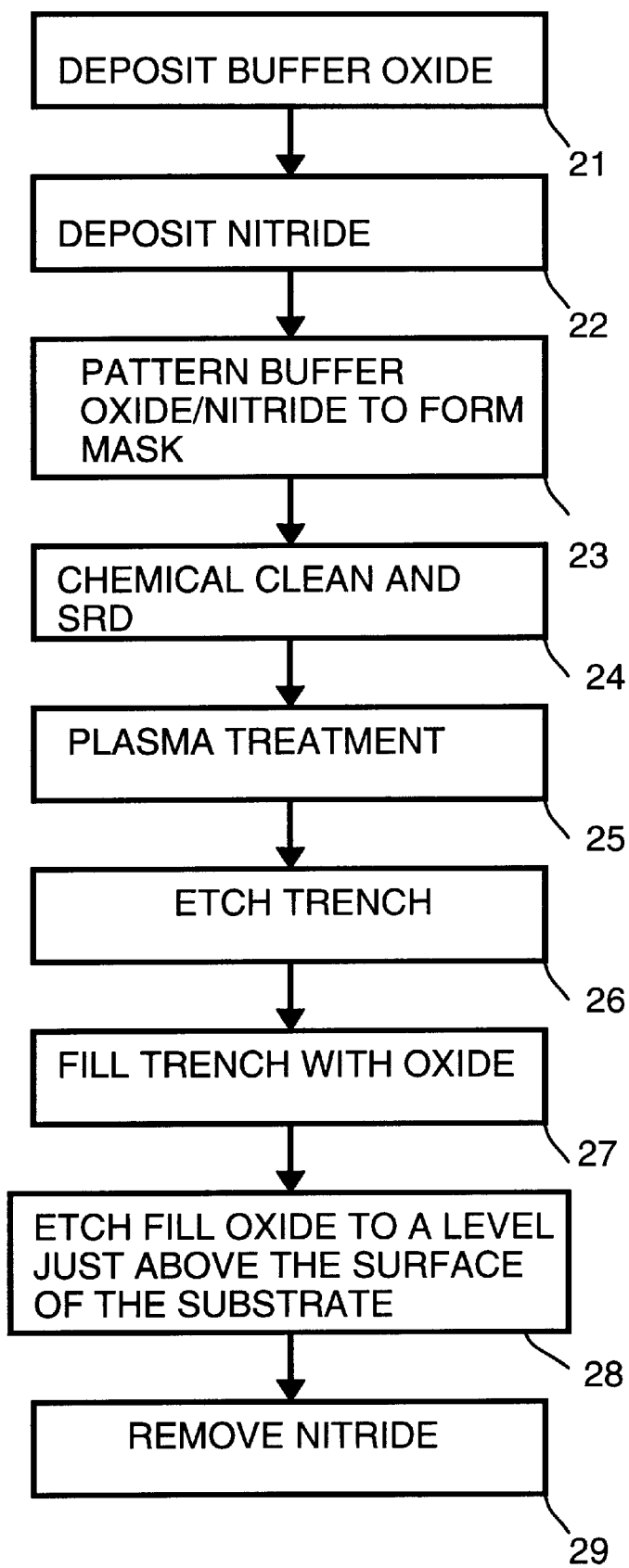
FIG. 1 is a flowchart for a shallow trench isolation process in accordance with a preferred embodiment of the present invention.

FIG. 1 is a flowchart for a shallow trench isolation process in accordance with a preferred embodiment of the present invention. In a step 21, a layer of buffer (pad) oxide is formed on a substrate of a semiconductor wafer. For example, the layer of buffer oxide is formed by thermal oxidation of silicon to grow the oxide. The layer of buffer oxide is, for example, 200 Angstroms (Å) thick. In a step 22, a layer of nitride is formed on top of the layer of buffer oxide. For example, the layer of nitride is formed by low pressure chemical vapor deposition (LPCVD, $SiH_2Cl_2$= $NH_3\bullet$ Dichlorosilane(Ammonia). The layer of nitride is, for example, 2000 Å thick. In a step 23, the nitride and buffer oxide is patterned by a dry etch process to define a trench area.

In a step 24, a convention clean of the trench area is performed. The clean is performed, for example, with wet chemicals such as sulfuric acid and hydrogen peroxide. The clean typically ends with a spin-rinse-dry (SRD).

In a step 25, an additional clean is performed. Specifically, the semiconductor wafer is placed in an ashing environment such as, for example, an inductively coupled plasma. Although such an ashing environment is used in the present embodiment, the present invention is also well suited to the use of various other well known ashing environments.

In one embodiment, the ashing environment operates at a pressure of approximately 1.2 Torr and a power of approximately 1000 Watts. $H_2O$ and $CF_4$ are then introduced into the ashing environment to form an inductively coupled plasma. For example, $H_2O$ is introduced at a flow rate of approximately 300 standard cubic centimeters per minute (SCCM). $CF_4$ is introduced at a flow rate of approximately 180 SCCM. Alternatively, in another embodiment of the present invention, gaseous polyfluorocarbons such as $C_2F_6$, or fluorinated hydrocarbons such as $CHF_3$, instead of $CF_4$, are introduced into the ashing environment at a flow rate of approximately 180 SCCM. Alternatively, other flow rates may be used to introduce the gases into the ashing environment. Also, other plasma sources such as microwave, can be used in place of the inductive coupled plasma.

Figure 2:
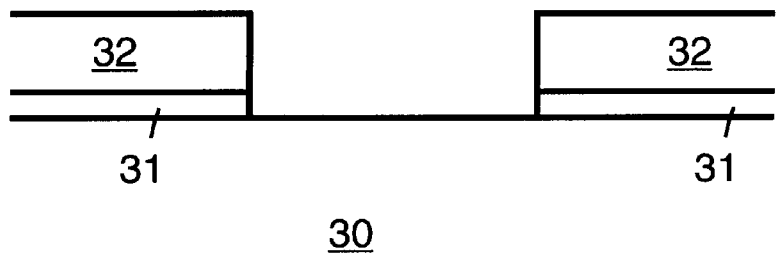
FIGS. 2, 3, 4, 5, 6 and 7 illustrate the shallow trench isolation process described in FIG. 1 in accordance with a preferred embodiment of the present invention.

For example, in one embodiment of the present invention, the ashing environment comprising $H2_O$ vapor and the gaseous fluorocarbon or a fluorinated hydrocarbon gas, efficiently and thoroughly removes water spots or polymer contaminants introduced over the trench area into residues. FIG. 2 illustrates the result of the completion of step 25. In FIG. 2, on top of a silicon substrate 30, sections 32 of a nitride layer are over sections of a buffer oxide layer 31. The trench area is clean.

Figure 8:
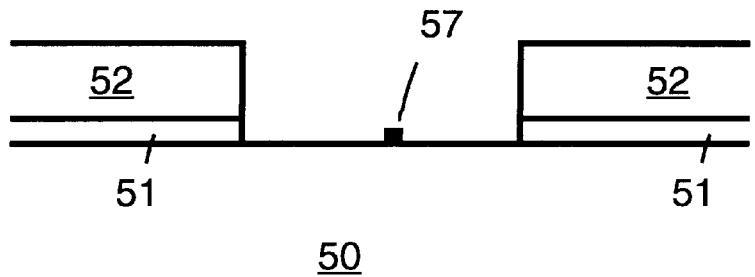
FIGS. 8, 9, 10 and 11 illustrate how not using the process set out in the flowchart in FIG. 1 can lead to formation of a leakage site.

FIG. 8 illustrates what can happen when step 25 is skipped. In FIG. 8, on top of a silicon substrate 50, sections 52 of a nitride layer are over sections of a buffer oxide layer 51. An impurity 57 remains on the trench area.

Figure 3:
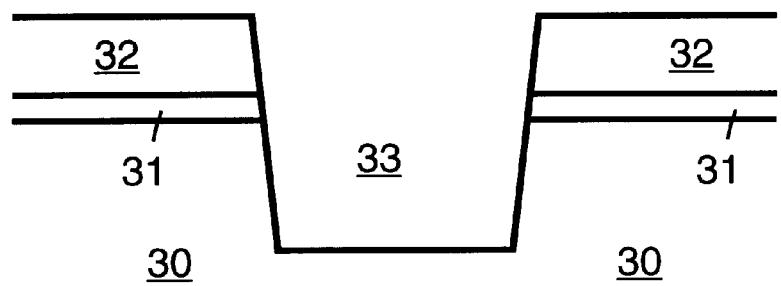

In a step 26, a trench is formed by, for example performing a dry etch of the silicon wafer. The dry etch can be one or more steps to etch the silicon and smooth out the sidewall profile. FIG. 3 illustrates the result of the completion of step 26. In FIG. 3, a trench 33 is shown etched in silicon substrate 30. For example, trench 33 is 0.5 microns wide and extends 0.4 microns below the surface of substrate 30.

Figure 9:
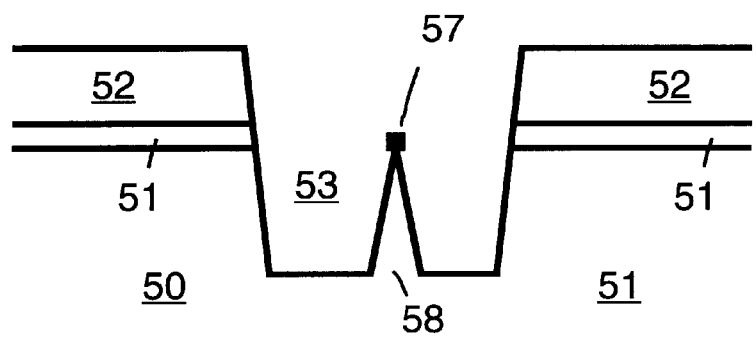

FIG. 9 illustrates what can happen when step 25 is skipped. In FIG. 9, a trench 53 is shown etched in silicon substrate 50. For example, trench 53 is 0.5 microns wide and extends 0.4 microns below the surface of substrate 50. In a region 58, however, micromasking has occurred preventing full excavation of the trench.

Figure 4:
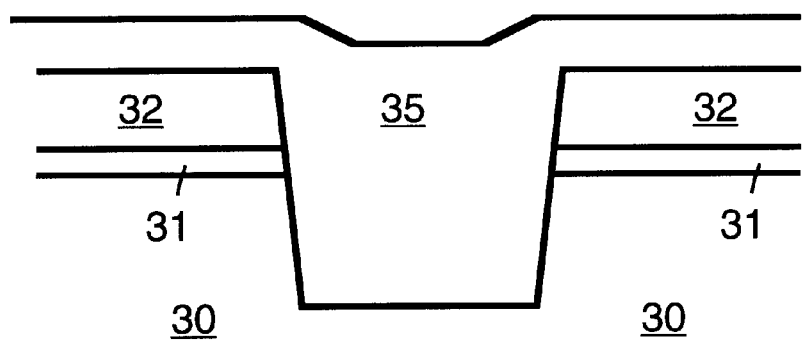

In a step 27, the trench is filled by chemical vapor deposition (CVD) with a fill oxide so that, for an average trench width, local planarization between the trench and the nitride mask is achieved. For example, the CVD oxide extends 0.7 micron above the top surface of the nitride layer. FIG. 4 illustrates the result of the completion of step 27. In FIG. 4, fill oxide 35 has filled trench 33 (shown in FIG. 3). For example, fill oxide 35 extends 0.7 microns above the top surface of the nitride layer 32.

Figure 10:
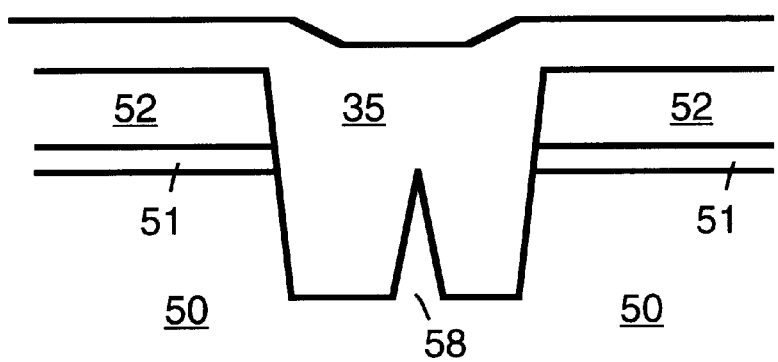

FIG. 10 illustrates what can happen when step 25 is skipped. In FIG. 10, fill oxide 55 has filled trench 53 (shown in FIG. 9). However, there is no oxide deposited in region 58 where micromasking occurred and the trench was not fully excavated.

In a step 28, the fill oxide is etched to a level just above the surface of the substrate. This etch is performed, for example, by a combination of chemical mechanical polish (CMP) process and a wet etch. The amount of fill oxide left above the surface of the substrate is such that future processing steps will remove/etch the remaining fill oxide, such that the remaining fill oxide will be aligned with, or slightly above the surface of the gate oxide.

Figure 5:
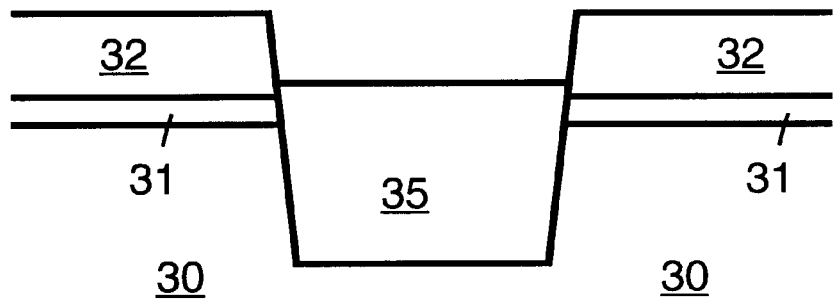

FIG. 5 illustrates the result of the completion of step 28. In FIG. 5, fill oxide 35 has been etched to a level just above the top surface of buffer oxide layer 31. For example, fill oxide 35 extends 800 Å above the top surface of the buffer layer 31.

Figure 6:
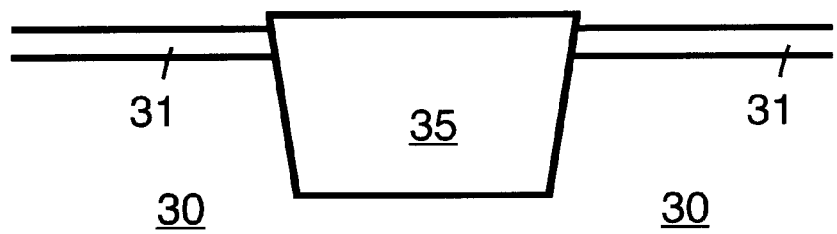

In a step 29, the nitride is stripped away, for example, by a wet etch using a "hot" phosphoric acid solution. The result is shown in FIG. 6. In FIG. 6, nitride layer 32 (shown in FIG. 5) is removed.

Figure 7:
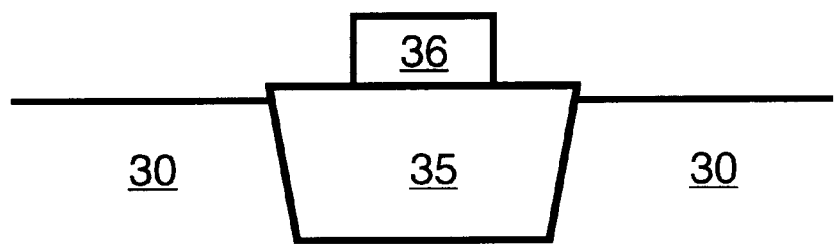
Figure 11:
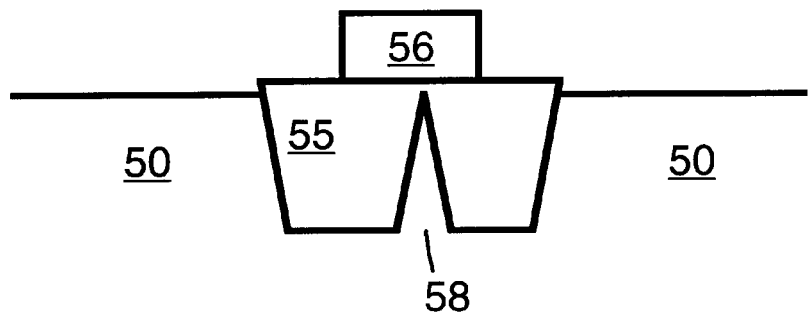

After additional conventional processing steps, including polysilicon deposition, mask etch and strip, for example, a polysilicon region is formed over the trench area. FIG. 7 shows a polysilicon region 36 located over fill oxide 35. FIG. 11 illustrates what can happen when step 25 is skipped. A polysilicon region 56 is located over fill oxide 55. However, there is very little oxide between polysilicon region 56 and region 58 where micromasking occurred. This can result in a leak between the substrate and polysilicon region 56.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming an isolation structure on an integrated circuit comprising the following steps:

(a) on a substrate, forming a layer of buffer oxide;

(b) forming a layer of nitride on the layer of buffer oxide;

(c) patterning the layer of nitride and the layer of buffer oxide to form a trench area;

(d) cleaning the trench area prior to etching by subjecting the substrate including the trench area to a plasma comprising $H_2O$ vapor and a gaseous fluorocarbon; and, (e) etching the substrate to form a trench within the trench area;

wherein the cleaning in step (d) is performed separately from the etching in step (e) and wherein the cleaning in step (d) is completed before beginning to etch the substrate in step (e).

2. A method as in claim 1 additionally comprising the following steps:

(f) filling the trench with a fill oxide;

(g) removing a part of the fill oxide so that a remaining part of the fill oxide remaining in the trench is above a top surface of the substrate; and, (h) removing the nitride layer.

3. A method as in claim 1 additionally comprising the following step performed before step (d):

(f) cleaning the trench area with wet chemicals; and, (g) performing a spin rinse dry.

4. A method as in claim 3 wherein in step (f) the wet chemicals include sulfuric acid.

5. A method as in claim 3 wherein in step (f) the wet chemicals include hydrogen peroxide.

6. A method as in claim 1 wherein in step (d), in order to form the plasma, the following substeps are performed:

(d.1) introducing $CF_4$ into an ashing environment; and, (d.2) introducing $H_2O$ vapor into the ashing environment.

7. A method for forming an isolation structure on an integrated circuit using shallow trench isolation comprising the following steps:

(a) forming a nitride mask to define a trench area on a substrate of the integrated circuit;

(b) cleaning the trench area prior to etching by subjecting the substrate including the trench area to a plasma comprising $H_2O$ vapor, and one of a gaseous fluorocarbon or a fluorinated hydrocarbon gas to remove impurities on the trench area; and, (c) etching the substrate to form a trench within the trench area;

wherein the cleaning in step (b) is performed separately from the etching in step (c) and wherein the cleaning in step (b) is completed before beginning to etch the substrate in step (c).

8. A method as in claim 7 additionally comprising the following steps:

(d) filling the trench with a fill oxide;

(e) removing a part of the fill oxide so that a remaining part of the fill oxide remaining in the trench is above a top surface of the substrate; and, (f) removing the nitride mask.

9. A method as in claim 7 additionally comprising the following step performed before step (b):

(d) cleaning the trench area with wet chemicals; and, (e) performing a spin rinse dry.

10. A method as in claim 9 wherein in step (d) the wet chemicals include sulfuric acid.

11. A method as in claim 9 wherein in step (d) the wet chemicals include hydrogen peroxide.

12. A method as in claim 7 wherein in step (b), in order to form the plasma, the following substeps are performed:

(b.1) introducing $CF_4$ into an ashing environment; and, (b.2) introducing $H_2O$ vapor into the ashing environment.

13. A method for forming an isolation structure on an integrated circuit using shallow trench isolation comprising the following steps:

(a) forming a nitride mask to define a trench area on a substrate of the integrated circuit;

(b) cleaning the trench area prior to etching by subjecting the substrate including the trench area to a plasma comprising $H_2O$ vapor, and a fluorinated hydrocarbon gas to remove impurities on the trench area; and, (c) etching the substrate to form a trench within the trench area;

wherein the cleaning in step (b) is performed separately from the etching in step (c) and wherein the cleaning in step (b) is completed before beginning to etch the substrate in step (c).

14. A method as in claim 13 additionally comprising the following steps:

(d) filling the trench with a fill oxide;

(e) removing a part of the fill oxide so that a remaining part of the fill oxide remaining in the trench is above a top surface of the substrate; and, (f) removing the nitride mask.

15. A method as in claim 13 additionally comprising the following step performed before step (b):

(d) cleaning the trench area with wet chemicals; and, (e) performing a spin rinse dry.

16. A method as in claim 15 wherein in step (d) the wet chemicals include sulfuric acid.

17. A method as in claim 15 wherein in step (d) the wet chemicals include hydrogen peroxide.

18. A method as in claim 13 wherein the gaseous fluorocarbon comprises $C_2F_6$.

* * * * *